United States Patent
Kim et al.

(10) Patent No.: US 10,670,655 B2
(45) Date of Patent: Jun. 2, 2020

(54) CRACK SENSOR INCLUDING POLYMER FOR HEALING CRACKS AND ELECTRONIC DEVICE INCLUDING THE SAME

(71) Applicants: RESEARCH & BUSINESS FOUNDATION SUNGKYUNKWAN UNIVERSITY, Suwon-si, Gyeonggi-do (KR); Industry-Academic Cooperation Foundation of Ajou University, Suwon-si, Gyeonggi-do (KR)

(72) Inventors: Tae Il Kim, Seoul (KR); Dae Shik Kang, Suwon-si (KR); Byeong Hak Park, Suwon-si (KR)

(73) Assignees: Research & Business Foundation Sungkyunkwan University, Suwon-si (KR); Industry-Academic Cooperation Foundation of Ajou University, Suwon-si (KR)

( * ) Notice: Subject to any disclaimer, the term of this patent is extended or adjusted under 35 U.S.C. 154(b) by 288 days.

(21) Appl. No.: 15/903,631

(22) Filed: Feb. 23, 2018

(65) Prior Publication Data
US 2018/0246165 A1 Aug. 30, 2018

(30) Foreign Application Priority Data
Feb. 24, 2017 (KR) .......................... 10-2017-0024828

(51) Int. Cl.
*G01R 31/28* (2006.01)
*H01L 21/66* (2006.01)

(52) U.S. Cl.
CPC ..... *G01R 31/2896* (2013.01); *G01R 31/2817* (2013.01); *G01R 31/2858* (2013.01); *H01L 22/20* (2013.01); *H01L 22/34* (2013.01)

(58) Field of Classification Search
CPC ............ G01R 31/2896; G01R 31/2858; G01R 31/2817; H01L 22/20; H01L 22/34
See application file for complete search history.

(56) References Cited

U.S. PATENT DOCUMENTS

| 4,542,183 | A | * | 9/1985 | Miller | ...................... | C08K 5/17 |
| | | | | | | 106/14.05 |
| 7,108,914 | B2 | * | 9/2006 | Skipor | ..................... | B01J 13/02 |
| | | | | | | 257/E21.505 |

(Continued)

FOREIGN PATENT DOCUMENTS

KR 20150064707 A 6/2015

OTHER PUBLICATIONS

Polymer Based Self-Healing Composites, Seokhoon Ahn et al., Polymer Science and Technology 25(2), Apr. 2014, pp. 135-139, The Polymer Society of Korea, http://www.dbpia.co.kr/Article/NODE06122504.

*Primary Examiner* — Freddie Kirkland, III
(74) *Attorney, Agent, or Firm* — NSIP Law

(57) ABSTRACT

A crack sensor with crack healing is provided. The sensor having: a substrate; a conductive layer disposed on the substrate, wherein the conductive layer contains cracks formed therein; and a polymer layer disposed between the substrate and the conductive layer, or disposed on the conductive layer and not between the substrate and the conductive layer; wherein a restoring force of the polymer layer suppresses further growth of the cracks or restores cracks.

12 Claims, 13 Drawing Sheets

(56) References Cited

U.S. PATENT DOCUMENTS

| | | | | |
|---|---|---|---|---|
| 8,890,649 B2* | 11/2014 | Saitou | ............... | G01B 7/18 |
| | | | | 252/511 |
| 9,490,045 B2* | 11/2016 | Tee | ............... | H01M 4/622 |
| 9,768,129 B2* | 9/2017 | Lee | ............... | H01L 23/573 |
| 9,927,311 B2* | 3/2018 | Kang | ............... | G01H 11/06 |
| 2004/0007784 A1* | 1/2004 | Skipor | ............... | B01J 13/02 |
| | | | | 257/788 |
| 2012/0165432 A1* | 6/2012 | Bateman | ............... | C08G 59/502 |
| | | | | 523/461 |
| 2016/0049217 A1* | 2/2016 | Tee | ............... | H01M 4/622 |
| | | | | 429/217 |
| 2016/0123820 A1* | 5/2016 | Kang | ............... | G01H 11/06 |
| | | | | 324/693 |

* cited by examiner

CRACK SENSOR INCLUDING POLYMER FOR HEALING CRACKS AND ELECTRONIC DEVICE INCLUDING THE SAME

CROSS-REFERENCE TO RELATED APPLICATION

This application claims the benefit of Korean patent application No. 10-2017-0024828 filed Feb. 24, 2017, the entire content of which is incorporated herein by reference for all purposes as if fully set forth herein.

FIELD OF THE INVENTION

The present disclosure relates to crack sensors, including healing polymers, that are configured to heal cracks and inhibit crack growth, and electronic devices including such sensors.

BACKGROUND OF THE INVENTION

The importance of sensors that can read mechanical stimuli in biometric integrated electronic devices or flexible integrated electronic circuits that detect sophisticated bio-signals or detect minute stresses is increasing. However, recently developed flexible sensors are difficult to detect accurate signals due to their low sensitivity.

To solve this sensitivity problem, a crack sensor has been developed which simulates the crack structure of a spider's vibrating sensory organs. These crack sensors have sensitivity close to 2,000 in the 2% strain range. However, due to the structural effect of the crack, the stress accumulates, and the crack deepens, and, eventually, the sensitivity decreases. Particularly, after about 1,000 repeated tests, the cracks become deep or broken, resulting in a decrease in sensitivity and stability.

SUMMARY OF THE INVENTION

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide a crack sensor that does not decrease in sensitivity thereof even when used repeatedly, and an electronic device including the sensor.

In a first aspect of the present disclosure, there is provided a crack sensor with crack healing, the sensor comprising: a substrate; a conductive layer disposed on the substrate, wherein the conductive layer contains cracks formed therein; and a polymer layer disposed between the substrate and the conductive layer, or disposed on the conductive layer and not between the substrate and the conductive layer; wherein a restoring force of the polymer layer suppresses further growth of the cracks or restores cracks.

In one embodiment of the first aspect, when the polymer layer is disposed on the conductive layer and not between the substrate and the conductive layer, the polymer layer is disposed in a region other than a region where the cracks are disposed.

In one embodiment of the first aspect, when the polymer layer is disposed between the substrate and the conductive layer, the polymer layer is disposed in a region other than a region where the cracks are disposed.

In one embodiment of the first aspect, when external energy is applied to the polymer layer, the restoring force of the polymer layer is increased.

In one embodiment of the first aspect, when at least one of heat, light, and electric energy is applied to the polymer layer, the restoring force of the polymer layer is increased.

In one embodiment of the first aspect, when external energy is locally irradiated to the polymer layer, cracks are locally restored.

In one embodiment of the first aspect, the restoring force is generated using a functional group generated via reaction between diacid and triamine in the polymer layer.

In one embodiment of the first aspect, the restoring force is generated via a bond between oxygen and hydrogen contained in the polymer layer.

In one embodiment of the first aspect, a glass transition temperature $T_g$ of the polymer layer is lower than or equal to a room temperature.

In one embodiment of the first aspect, the polymer layer is formed by a solution process.

In one embodiment of the first aspect, when external stimulation is applied to the sensor, the cracks are electrically short-circuited, or a spacing between the cracks changes, such that an electrical resistance value in the conductive layer is changed.

In one embodiment of the first aspect, a depth of the crack has a nanometer or micrometer size.

In one embodiment of the first aspect, the conductive layer includes at least one selected from a group consisting of platinum, nickel, copper, gold, silver, iron, chromium, magnesium, zinc, tin, aluminum, cobalt, manganese, tungsten, cadmium, palladium, and carbon, or a mixture of two or more thereof.

In one embodiment of the first aspect, the sensor is used as one of a mechanical sensor, a chemical sensor and a gas sensor.

In a second aspect of the present disclosure, there is provided an electronic device including a crack sensor with crack healing, the sensor comprising: a substrate; a conductive layer disposed on the substrate, wherein the conductive layer contains cracks formed therein; and a polymer layer disposed between the substrate and the conductive layer, or disposed on the conductive layer and not between the substrate and the conductive layer; wherein a restoring force of the polymer layer suppresses further growth of the cracks or restores cracks.

The crack sensor according to one embodiment of the present disclosure includes the healing polymer, thereby maintaining the durability of the crack sensor by inhibiting crack growth and reducing the width of the crack using the healing polymer. Due to its high durability, the present crack sensor may be applied to flexible electronic circuit devices with integrated electronic circuits, electronic devices inserted into living bodies, and complex mechanical systems.

In another embodiment, the sensor according to the present invention may be applied to a field of aviation, robot, electronic skin, etc. in the form of a multifunctional integrated electronic circuit or a mechanical stimulus sensor requiring high durability. Furthermore, the present invention may be employed in a manufacturing process of a strain-gauge sensor having a high durability, which may be applied to a wearable electronic device and an electronic device inserted in the living body.

Furthermore, by irradiating the sensor with additional external energy, the crack healing capability may be improved. Localized external energy may be applied to heal the local area. The external energy is not limited to a specific healing mechanism, and various types of energies may be applied.

Further, since the present device is a device having a simple structure, the manufacturing cost of the device is low, and the manufacturing process thereof is very simple, and mass production thereof is possible.

DETAILED DESCRIPTIONS

Figure 1:
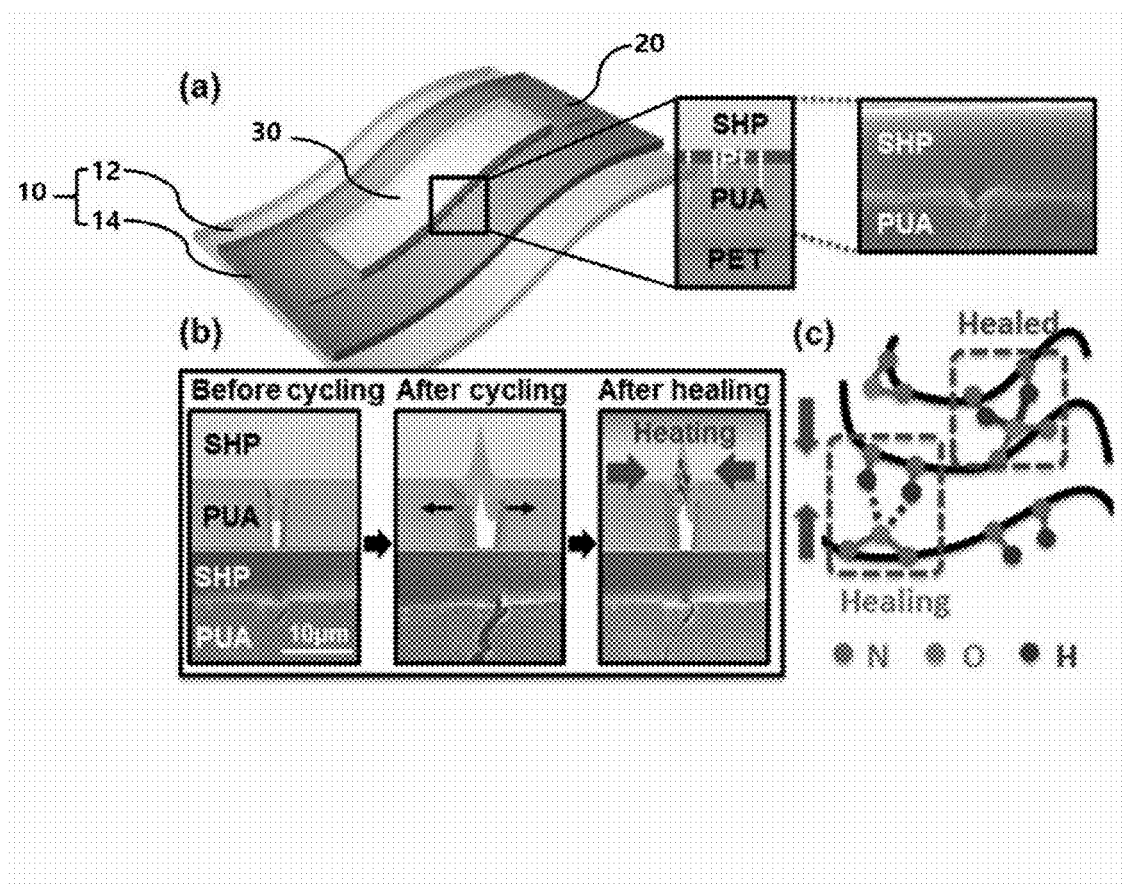
FIG. 1a is a schematic representation of a crack sensor according to one embodiment of the present disclosure.
FIG. 1b is a schematic drawing and image photograph showing crack changes before, after crack sensor use and after the healing of the crack sensor.
FIG. 1c is a schematic diagram showing the mechanism of crack recovery.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising" "includes", and "including", when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art.

Further, the use of "may" when describing embodiments of the present disclosure refers to "one or more embodiments of the present disclosure."

According to one embodiment of the present disclosure, a healing polymer is used to heal the crack of the crack sensor, or to keep the crack spacing narrow. Such a sensor has a stable number of driving in a constant strain range. After cracking, self-healing, or healing using external energy stimuli, may restore the original performance of the sensor.

According to one embodiment of the present disclosure, a crack sensor comprises a substrate; a conductive layer positioned on the substrate and including a crack formed therein; and a polymer layer formed between the substrate and the conductive layer and/or on the conductive layer without contacting the substrate, wherein via a restoring force of the polymer layer, further crack growth may be suppressed, and the crack may be restored.

In this connection, in addition to the above-described components of the present sensor, a variety of additional components may be included. The construction of the additional various components may be well-known, and a description thereof will be omitted.

The sensor includes the substrate. The substrate serves as a support for the sensor. The substrate is not particularly limited and may be variously configured according to the kind and purpose of the sensor. For a flexible sensor, a flexible substrate may be used. Any flexible substrate may be used as long as it meets the purpose of providing the flexible sensor.

The substrate may have a single layer structure or a multi-layer structure. When the substrate has the multi-layer structure, a soft polymer layer may be formed on a base layer. The soft polymer may be selected from the group consisting of polyurethane acrylate (PUA), urethane, epoxy, polystyrene, polyethylene glycol, NOLAND optical adhesive NOA, silicone resin-based polydimethylcellulose (PDMS). The base film may be selected from a group consisting of a polyethylene terephthalate (PET) film, a polyimide film, a polydimethylsiloxane (PDMS) film, etc. These are merely examples and the present invention is not limited thereto.

The sensor includes a conductive layer located on at least one face of the substrate. In this connection, the placement of the conductive layer on the substrate includes the case where the conductive layer is directly located on the substrate, and a case where an additional layer is disposed between the substrate and the conductive layer.

The conductive layer may include a metal. The conductive layer may include at least one conductive material selected from a group consisting of platinum, nickel, copper, gold, silver, iron, chromium, magnesium, zinc, tin, aluminum, cobalt, manganese, tungsten, cadmium, palladium, and carbon, or a mixture of one or more thereof.

Furthermore, the thickness of the conductive layer is not limited to a certain value. In this connection, it is preferable that the thickness becomes such a thickness that a crack may be formed in the conductive layer by a mechanical action such as tensile and bending. The conditions for forming such a crack may vary depending on the kind of each metal.

The conductive layer includes a crack. The crack may have various shapes, and the shape of the crack may vary depending on the shape of the grain boundary of the conductive layer. In addition, the degree of crack generation may also vary depending on the thickness of the conductive layer, the forming conditions thereof, and the like. However, the present invention is not limited to this.

The cracks may be distributed as follows: the faces of two adjacent cracks may be in contact with each other, or the faces of two adjacent cracks may be spaced from one another. As the two adjacent cracks move via external physical stimuli, the gap between the faces of two adjacent cracks may become larger. In the case where the faces of two adjacent cracks are in contact with each other, these contact faces may be spaced apart from each other via the external physical stimuli. As a result, the electrical resistance of the electrically conductive layer may be changed or an electrical short may occur. Alternatively, the faces of the cracks that were separated by the external physical stimulus come into contact again due to the application of another external stimulus, resulting in a change in electrical resistance. Alternatively, the electric resistance value of the conductive layer is increased because the faces of the cracks that were initially in contact move due to the external stimulation. Thus, this allows measuring the presence or absence of the external stimulus. In addition, the faces of the cracks that were initially not in contact and spaced a few nanometers apart could be brought into contact with each other by external stimulation, thereby causing a change in electrical resistance. In this way, the crack sensor may be realized using such electrical change characteristic.

However, when the crack sensor is repeatedly used, the gap between the cracks spreads, or the depth of the crack deepens, so that the performance of the crack sensor deteriorates. To prevent this, the crack sensor according to the present disclosure includes a healing polymer layer. Due to the healing polymer, it is possible to prevent the crack from further growing. In addition, external energy may be applied to the healing polymer to restore the crack.

In one embodiment, the polymer layer may be positioned between the substrate and the conductive layer. Alternatively, the polymer layer may be located on the conductive layer without contacting the substrate. Alternatively, a first polymer layer may be positioned between the substrate and the conductive layer, and a second polymer layer may be positioned in contact with the conductive layer on the conductive layer without contacting the substrate. When the polymer layer is placed on the conductive layer on the conductive layer without contacting the substrate, the polymer layer is preferably located on the conductive layer in a region other than the region where the cracks are located. This is because, if the polymer layer is located on the conductive layer in the region where the cracks are located and, thus, the polymer penetrates into the cracks, the sensitivity of the crack sensor may be lowered.

Particularly, when external energy is irradiated to the polymer layer, the restoring force of the crack sensor is improved. The external energy is preferably, but not limited to, at least one of light, heat, infrared, ultraviolet, and electric energy. Furthermore, when the polymer layer is locally irradiated using external energy, the cracks may be locally restored around the portion irradiated with the external energy.

The restoring force may be generated by various mechanisms depending on the type of polymer employed and the type of external energy applied. In one example, the mechanism may be a combination of oxygen and hydrogen. In addition, the mechanism may include hydrogen bonding of the functional groups generated via the reaction between diacid and triamine. Via this mechanism, the crack may be restored or healed.

In addition, the glass transition temperature $T_g$ of the polymer is preferably not higher than room temperature. Thus, even when the crack sensor is used at room temperature, the vibration of the sensor is not hindered by the flexibility of the polymer layer.

In this connection, the polymer layer is preferably applied by a solution process. The polymer layer may be applied on the conductive layer having a crack pattern defined therein by a method such as bar coating or spin coating.

The crack sensor may be used as an ultra-sensitive sensor, and may not be particularly limited, but may be applied to various technical fields. Illustratively, the sensor may be used as a mechanical sensor, a chemical sensor, and a gas sensor. Additionally, another embodiment of the present disclosure includes an electronic device including a crack sensor as described above. The crack sensor may be a pressure sensor. The crack sensor may be applied to any electronic device as long as it meets the purpose of the present disclosure.

When the healing polymer is applied on a mechanical sensor, the sensitivity of the sensor is maintained even at more than 10,000 repetitive tests at 2% strain. The conventional sensor has a tendency that the sensitivity of the sensor is not maintained after more than 1,000 repetitive tests. However, the present crack sensor with the healing polymer applied thereon has a ten-fold more stability than the conventional sensor. The same tendency may occur in several healing processes. The basic base resistance of the sensor increases as the repeat test progresses. In this regard, the healing polymer in the healing process helps to reduce the width of the crack, thereby, the base resistance returns to its original value and maintains the original performance of the sensor. The sensitivity reduced after more than 10,000 repetitive tests may be quickly restored by accelerating the healing by applying additional external energy thereto, as described above. The sensitivity of the healed sensor may be maintained in the similar level during the healing process.

The performance and resistance variation according to strain of the sensor on which the polymer layer is applied has substantially similar pattern between at the initial time and after healing process. Therefore, the hysteresis phenomenon may not occur. Furthermore, resistances over time after 15 or more iterative tests may be substantially constant.

EXAMPLES

Hereinafter, the present disclosure will be described in more detail using more specific examples. The examples and drawings, which are incorporated in and form a part of this specification and in which like numerals depict like elements, illustrate embodiments of the present disclosure and, together with the description, serve to explain, but not to limit, the principles of the disclosure.

Example 1

The restoring force of the healing polymer is created via the hydrogen bond of the functional group formed by the reaction between diacid (Empol 1016, Shijiazhuang Shuliang Commerce Trade Co., Ltd., China) and triamine (diethyelenetriamine).

First, 41.5 g of Empol 1016 and 17 g of diethyelenetriamine were reacted together under argon vapor at 160-degree C. for 24 hours. Thereafter, 1.5 g of the reaction product is collected. The collected reaction product and 200 mg of urea were reacted with each other at 135-degree C. for 6 hours. As a result, a healing polymer was prepared.

Furthermore, a 10 µm thick PUA (poly-urethane acrylate) as a soft polymer layer was applied on 50 µm PET (polyethylene terephthalate) as a base layer. On the soft polymer layer, platinum Pt is deposited to a thickness of 20 nm to obtain a stack. Thereafter, the stack was bent using a rod having a curvature of 1 mm to generate cracks to produce a crack sensor. A self-healing polymer (SHP) was coated on the sensor by bar coating to a thickness of 40 µm to fabricate a self-healing sensor.

The resulting sensor was tested repeatedly 25000 times. Thereafter, external heat was applied to the sensor such that three healing steps were performed for 10 minutes. As a result, an experiment for restoring the gap between the cracks was conducted.

An example of the restoration process of the crack sensor including the above-described healing polymer layer is schematically shown in FIG. 1.

To be specific, FIG. 1a is a schematic representation of a crack sensor according to one embodiment of the present disclosure. FIG. 1b is a schematic drawing and image photograph showing crack changes before, after crack sensor use and after the healing of the crack sensor. FIG. 1c is a schematic diagram showing the mechanism of crack recovery.

As shown in FIG. 1a, the substrate 10 comprises the base layer 12 and the soft polymer layer 14. The conductive layer 20 is formed on the substrate 10. The polymer layer 30 is formed on the conductive layer 20.

The enlarged view of FIG. 1a shows the self-healing polymer (SHP), the conductive layer (platinum Pt), the soft polymer layer (PUA), and the base layer (polyethylene terephthalate, PET).

Furthermore, as shown in FIG. 1b, when comparing the crack sensor states before and after cycling, the repeated use of the crack sensor leads to an increase in the crack gap and in the crack depth. After the heating was applied, it was confirmed that the crack gap was reduced. As shown in FIG. 1c, cracks were restored via the bond between hydrogen and oxygen.

Example 2

To test the performance of a sensor including the healing polymer, a sensor of the present invention including the healing polymer and a conventional sensor were compared to each other.

Figure 2:
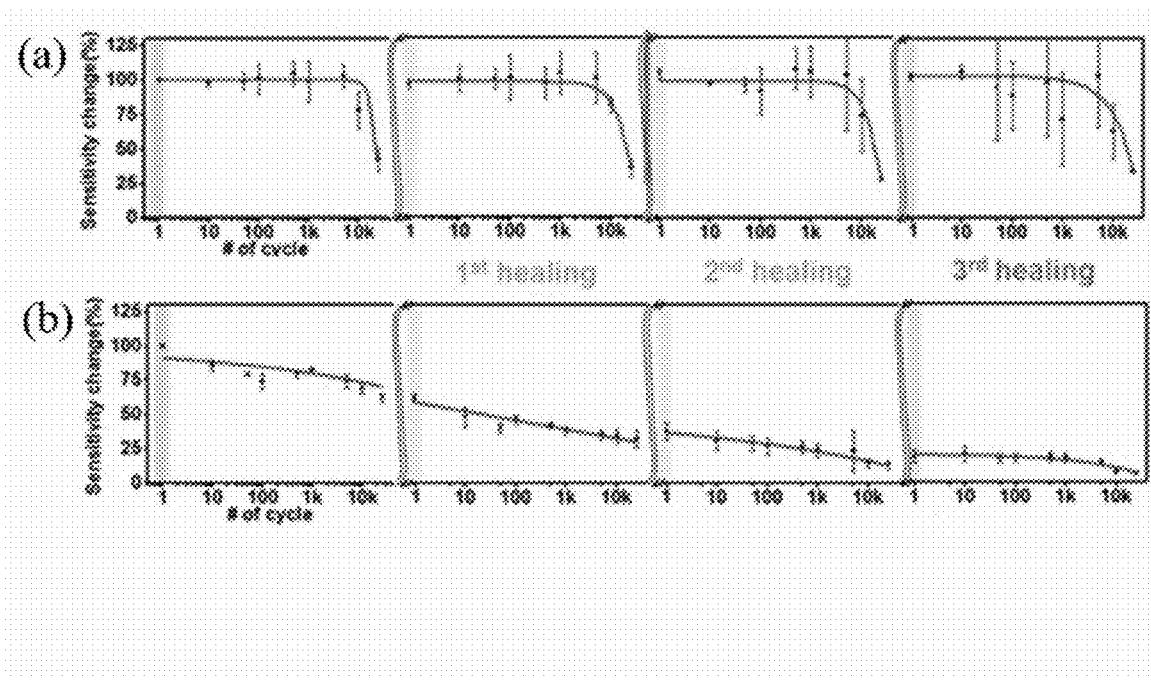
FIG. 2 is a graph showing sensitivity changes for crack sensors according to one embodiment of the present disclosure and conventional crack sensors

Specifically, the sensor manufactured in the example 1 was subjected to 25,000 repetitive tests by applying a force at a rate of 50 mm/min at a strain of 2%, which is the operating range of the sensor. Thereafter, healing was performed three times at an external temperature of 50 DEG C. for 10 minutes. The sensitivity of the sensor is measured, and the result graph is shown in FIG. 2a. For comparison, a repetitive test on a conventional sensor was performed in the same manner, and, then, the sensitivity thereof was measured, and the resulting graph was added to FIG. 2b.

As shown in FIGS. 2a and 2b, in the case of the conventional sensor, the sensitivity decreased gradually after 1,000 repeated tests. On the contrary, in the case of the sensor having the healing polymer, its sensitivity was maintained even after 10,000 repeated tests. In the sensor with the healing polymer, the sensitivity was recovered using the self-healing after the sensitivity had deteriorated. Conversely, in the case of the conventional sensor, it was confirmed that the sensitivity was not recovered. The performance of the present sensor may be maintained after 25,000 iterative tests are repeated four times.

Example 3

Figure 3:
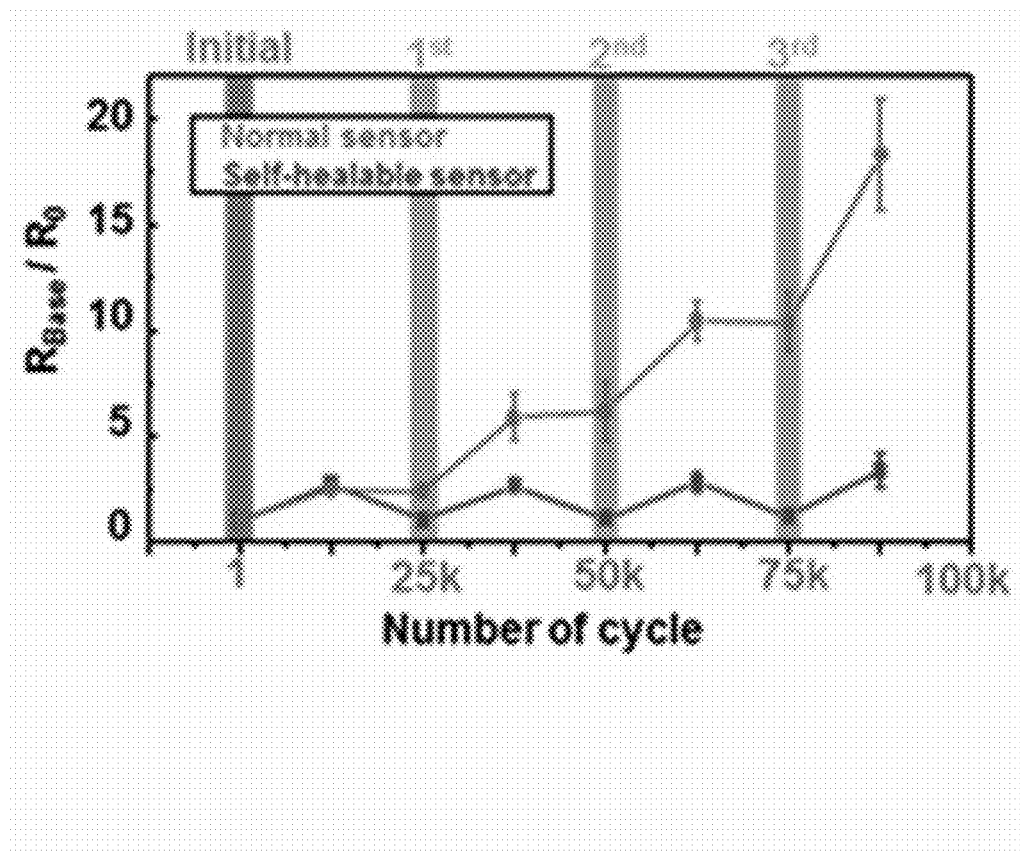
FIG. 3 is a graph showing changes in the fundamental resistance values for crack sensors according to one embodiment of the present disclosure and conventional crack sensors.

To confirm that the sensitivity is recovered, additional experiments were conducted to confirm the change in base resistance affecting the sensitivity. The base resistance value was measured for a crack sensor (self-healing sensor) manufactured in Example 1 and a conventional sensor employed as a comparison example. The results are shown in FIG. 3.

The restoration of the sensitivity is due to the nature of the base resistance returning to its original value after repeated testing. Depending on the recovery of the base resistance, it is determined whether the sensitivity is restored. As shown in FIG. 3, in the case of the conventional sensor, after repeated testing, the base resistance continued to increase. However, in the case of the sensor including the self-healing polymer, the base resistance returned to the original state after the healing process.

Example 4

Figure 4:
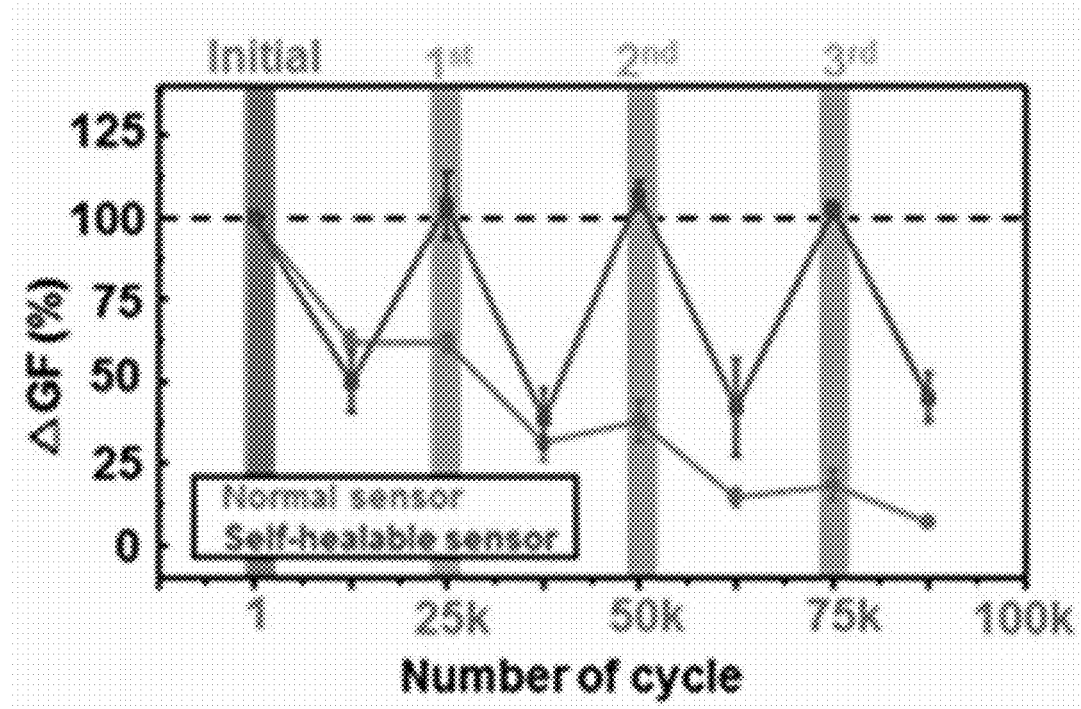
FIG. 4 is a graph showing the sensitivity for a crack sensor according to one embodiment of the present disclosure and a conventional crack sensor.

The sensitivity of the crack sensor (self-healing sensor) fabricated in example 1 above and that of the conventional sensor used as a comparison example were measured. The resulting graph is shown in FIG. 4. As shown in FIG. 4, the crack sensor according to the present disclosure is subjected to a healing process, and, thus, the sensitivity of the sensor is restored to a value similar to the initial value.

Example 5

Figure 5:
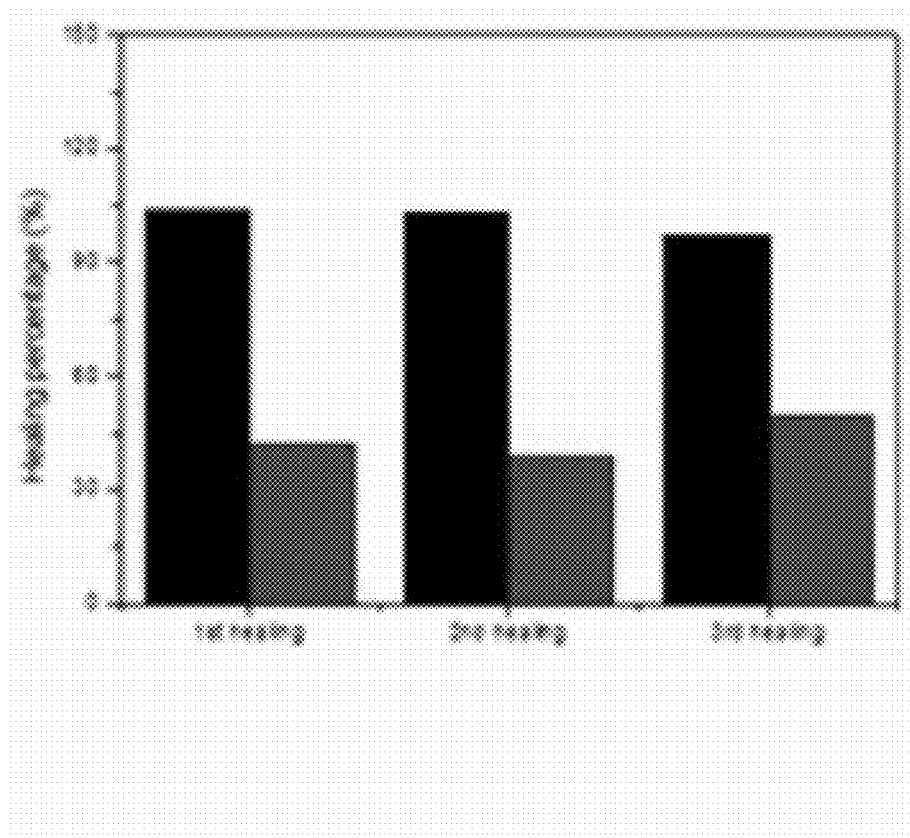
FIG. 5 is a graph showing the degree of healing for the crack sensor according to one embodiment of the present disclosure and for the conventional crack sensor.

In order to confirm the degree of healing of the crack sensor (self-healing sensor) manufactured according to the example 1 and that of the conventional sensor used as the comparison example, first, second, and third healing processes were performed. Healing percentage was measured for each of the 1st, 2nd and 3rd healing process. The resulting graph is shown in FIG. 5.

Example 6

To investigate the sensor characteristics and post-healing characteristics of the self-healing polymer sensor, tensile tests were performed on healed sensors. The tensile tests were performed by applying a force corresponding to 2% strain at a tensile rate of 1 mm/min, and then measuring a change in electrical resistance over time was carried out.

Figure 6:
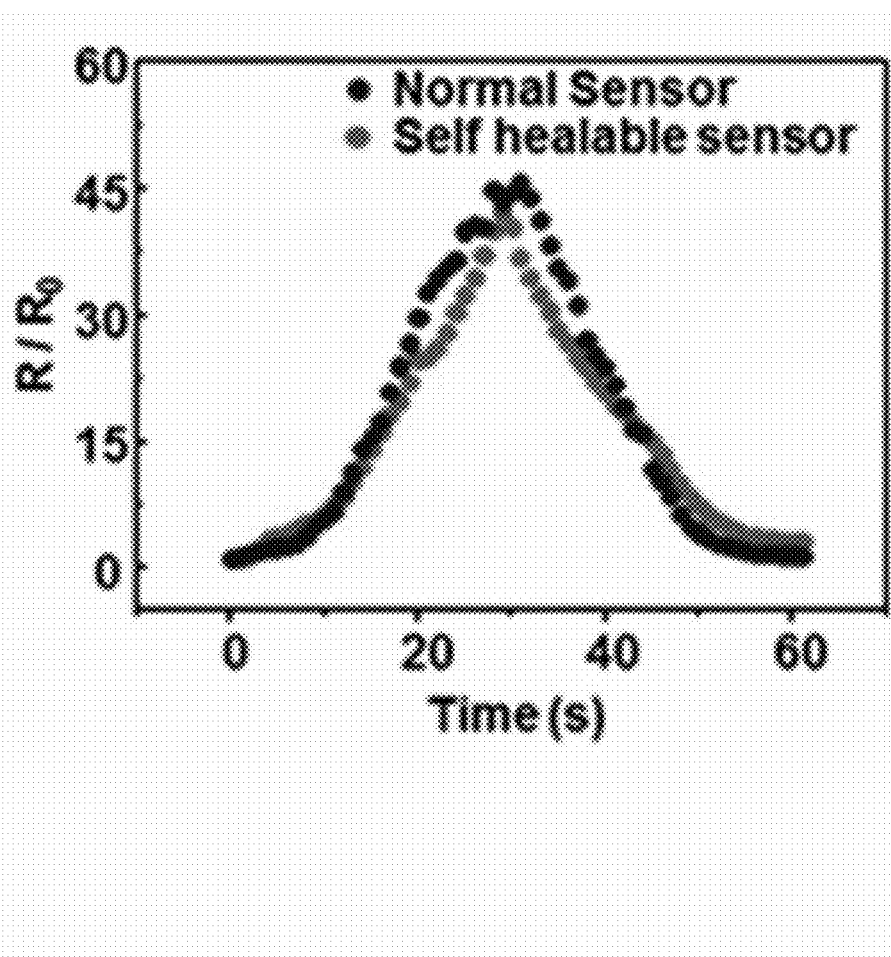
FIG. 6 is a graph showing changes in resistance value over time for a crack sensor according to one embodiment of the present disclosure and for a conventional crack sensor.

Specifically, for the crack sensor (self-healing sensor) fabricated in the example 1, the change in a resistance value over time was measured before and after the healing process. FIG. 6 shows the resulting graph. The graph shown in FIG. 6 is a graph comparing electric signals for the conventional sensor and the sensor including the healing polymer. As may be seen from the figure, it was confirmed that the shapes of the graphs before and after applying the self-healing polymer were similar to each other.

Example 7

Figure 7:
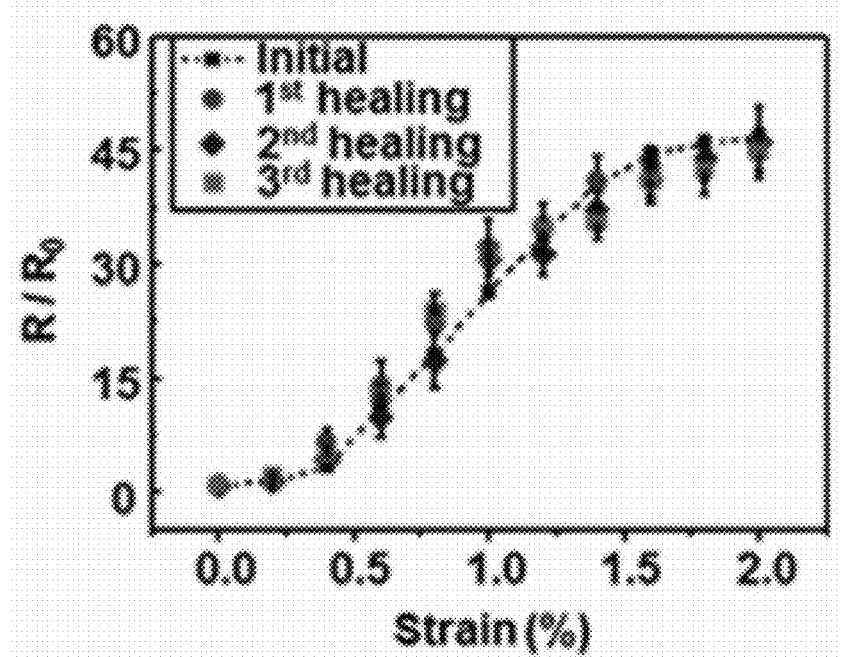
FIG. 7 is a graph showing changes in the resistance value for the crack sensor according to one embodiment of the present disclosure and the conventional crack sensor.

A first healing process, a second healing process, and a third healing process were performed on the crack sensor (self-healing sensor) manufactured in Example 1 above. For each healing process, the change in resistance value over strain was measured. FIG. 7 shows the resulting graph. As shown in FIG. 7, it may be confirmed that the sensor which was healed first, second, third times shows a similar graph shape depending on the strain. Therefore, it was confirmed that even after healings, the characteristics of the sensor did not change, and the stability was maintained.

Example 8

Figure 8:
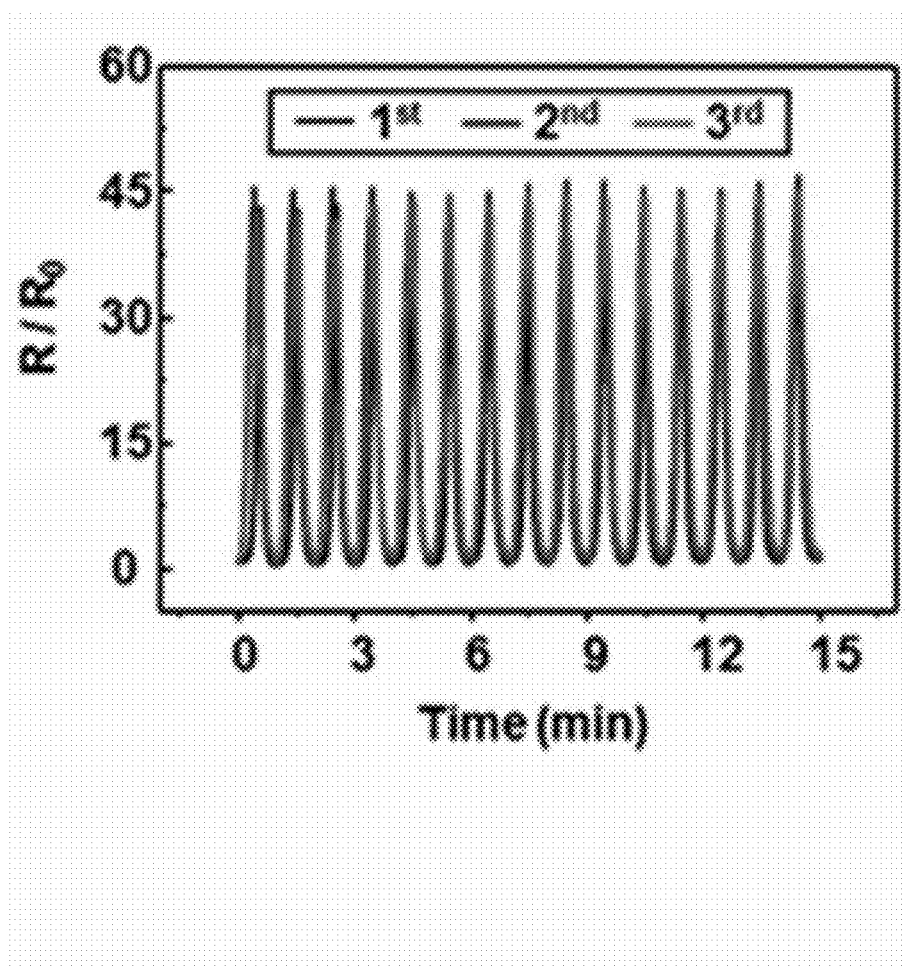
FIG. 8 shows a graph showing changes in electrical resistance measurements when an operation in which the crack sensor according to one embodiment of the present disclosure is stretched by 2% strain and then restored to its original state (0% strain state) is repeated 15 times.

For the crack sensor fabricated in the example 1, additional experiments were conducted to confirm the durability. FIG. 8 is a graph showing the durability of the sensor coated with the self-healing polymer. As shown in FIG. 8, after 15 repetitive tests, the sensitivity of the sensor was maintained, and the same characteristics were shown after and before healing.

Example 9

Figure 9:
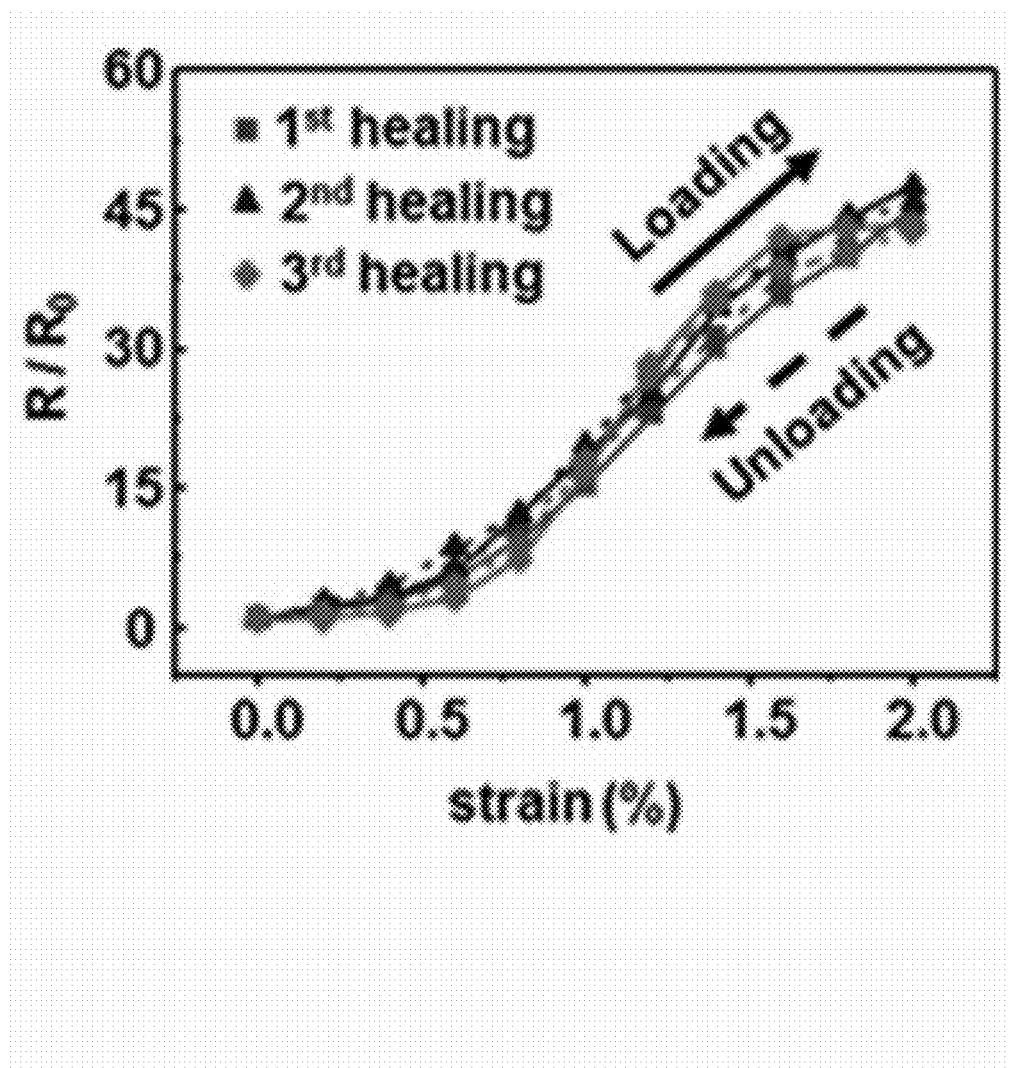
FIG. 9 is a graph showing hysteresis in a crack sensor according to one embodiment of the present disclosure.

The tensile test was performed so that the crack sensor according to one embodiment of the present disclosure is stretched to 2% strain, and, then, the sensor returned to its original state (0% strain state). The change in electrical resistance during this tensile test is shown graphically in FIG. 9. The graph shown in FIG. 9 shows hysteresis. It was confirmed that the shape of the graph when the stimulus was applied to the sensor and the shape of the graph when the stimulus was relaxed almost coincided with each other. As a result, the sensor according to one embodiment of the present disclosure confirms that the sensor has a requirement for an excellent sensor without hysteresis.

Example 10

Figure 10:
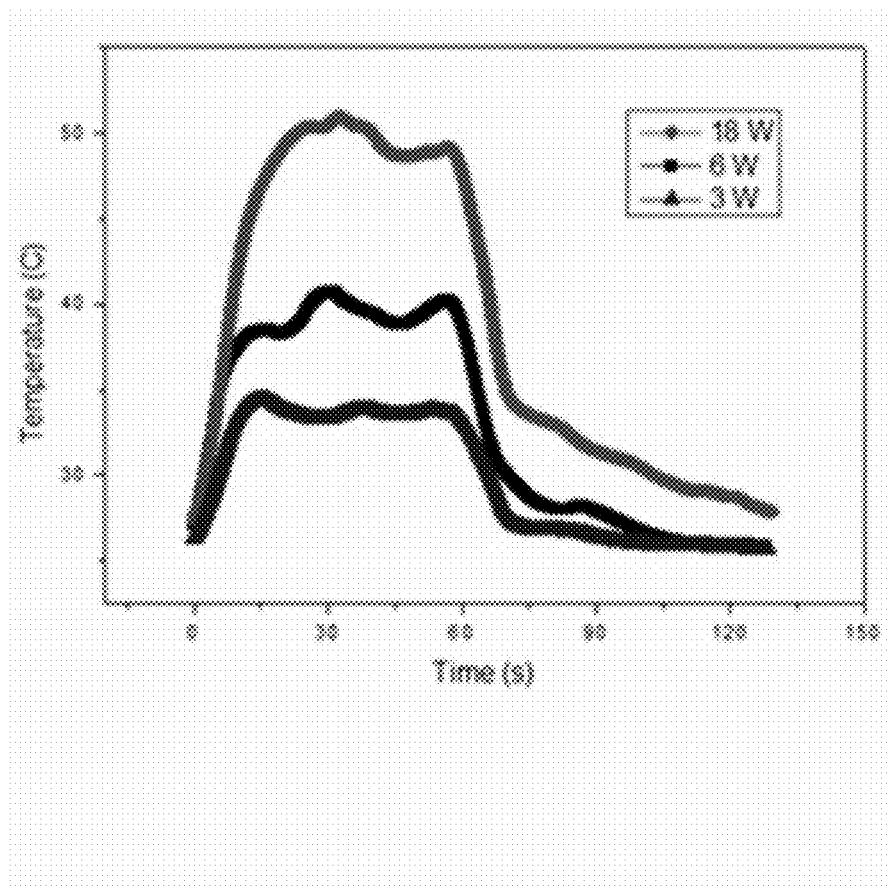
FIG. 10 is a graph showing temperature changes over intensity when an infrared LED light beam is illuminated onto a crack sensor according to one embodiment of the present disclosure.

Additional experiments were conducted to confirm the effect of external energy irradiation onto the sensor fabricated in Example 1 above. First, an infrared LED beam was locally irradiated to the polymer layer as external energy. The intensity of the beam was controlled to 3 W, 6 W and 18 W. At the same time, the temperature of the sensor was measured over time. The results are shown in FIG. 10. As shown in FIG. 10, the temperature of the sensor increases as the intensity of the beam increases.

Figure 11:
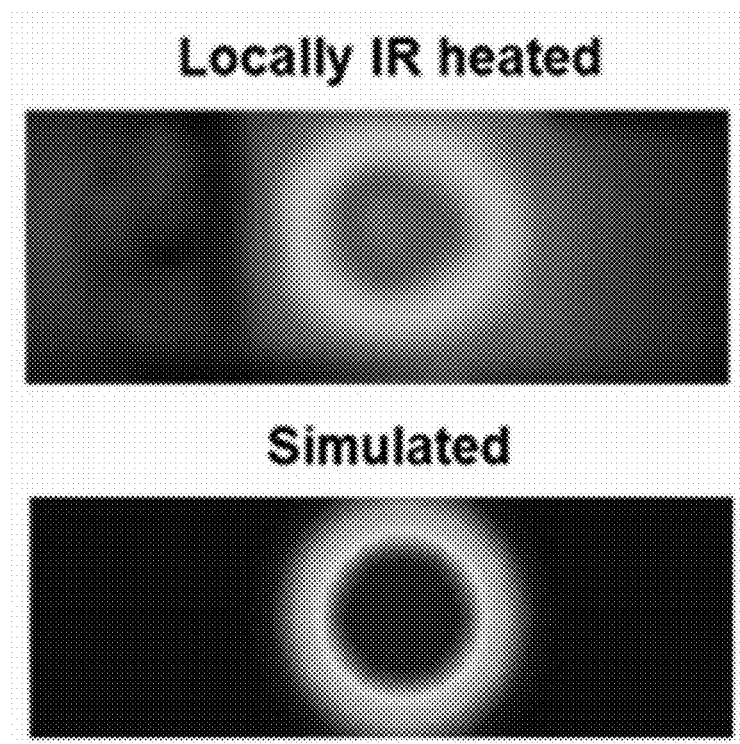
FIG. 11 is an image showing the change in temperature when locally illuminating an infrared LED light beam onto a crack sensor according to one embodiment of the present disclosure.

Furthermore, the temperature distribution image is shown in FIG. 11. As shown in FIG. 11, in the similar manner to the simulation case, the temperature of the polymer surface was found to increase locally. It was confirmed that the heating or energy application heals cracks locally without affecting other factors.

Example 11

Figure 12:
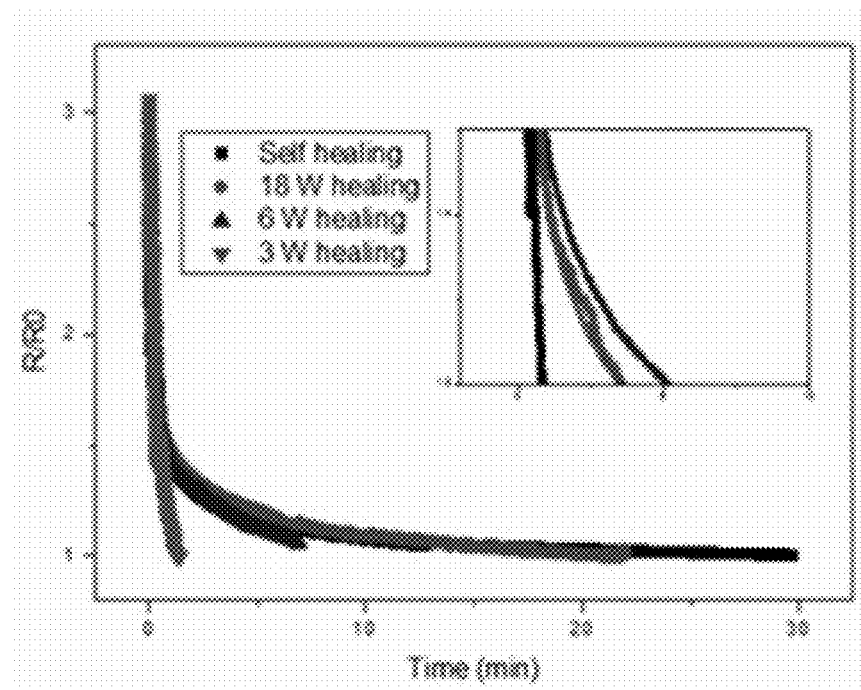
FIG. 12 is a graph showing changes in resistance value over time when an infrared LED light beam is illuminated onto a crack sensor according to one embodiment of the present disclosure.

The change of electric resistance over time was measured when irradiating to the polymer layer the infrared LED beam whose intensity was controlled to 3 W, 6 W, and 18 W, compared with the case of the self-healing. The resulting graph is shown in FIG. 12. As shown in FIG. 12, the base resistance was found to return to its initial state even with healing of about 3 minutes. That is, the recovery rate was about 10 times faster in the infrared irradiation than in the self-healing case. This shows that the infrared healing accelerates the sensitivity being returned to its original state.

Example 12

Figure 13:
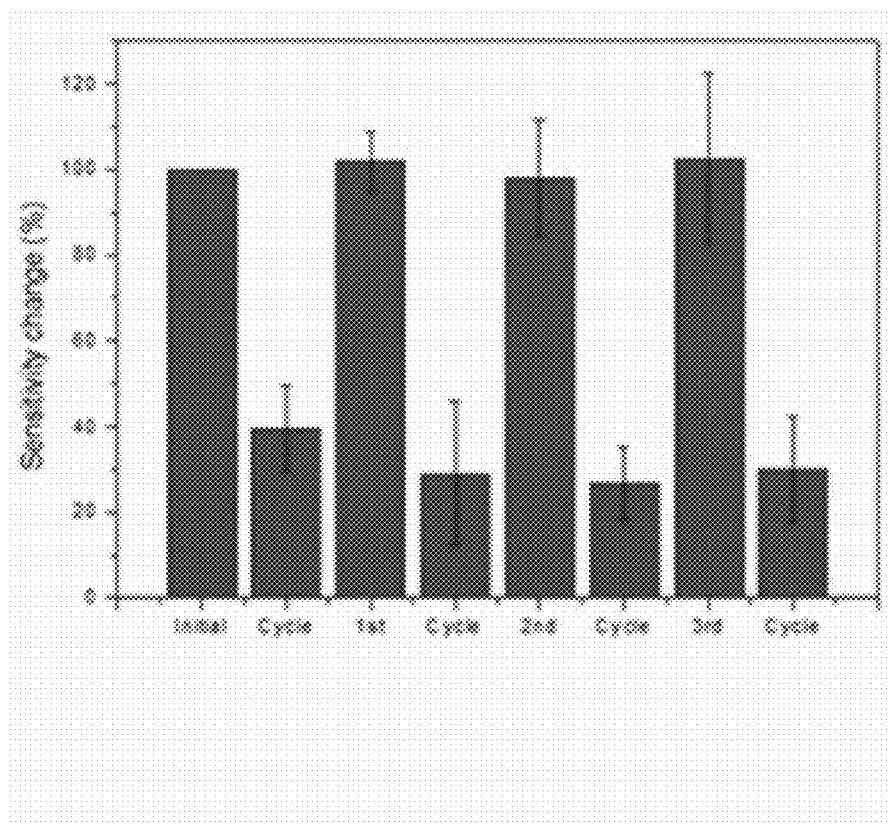
FIG. 13 is a graph showing the change in sensitivity when an infrared LED light beam is illuminated onto a crack sensor according to one embodiment of the present disclosure.

In addition, to confirm the change in sensitivity, each sensitivity was measured before using the sensor, after one time healing of the sensor after repeated use of the sensor, after two times healing of the sensor after repeated use of the sensor, and after three times healing of the sensor after repeated use thereof. FIG. 13 shows the results.

While the foregoing description of the present disclosure has been provided with reference to preferred embodiments of the present disclosure, those skilled in the art will appreciate that various modifications and changes may be made to the present disclosure without departing from the spirit and scope of the present disclosure set forth in the claims that follow.

The invention claimed is:

1. A crack sensor with crack healing, the sensor comprising:
   a substrate;
   a conductive layer disposed on the substrate, wherein the conductive layer contains cracks formed therein; and
   a self-healing polymer layer disposed directly on the conductive layer;
   wherein a restoring force of the polymer layer suppresses further growth of the cracks or restores cracks,
   wherein a polymer of the self-healing polymer layer does not penetrate into the cracks; and
   wherein a glass transition temperature Tg of the polymer is lower than or equal to a room temperature.

2. The sensor of claim 1, wherein the restoring force of the self-healing polymer layer is configured to increase in response to an external energy applied to the self-healing polymer layer.

3. The sensor of claim 2, wherein when the external energy is at least one of heat, light, and electric energy.

4. The sensor of claim 3, wherein the external energy is configured to be locally irradiated to the self-healing polymer layer, and the cracks are configured to be locally restored.

5. The sensor of claim 2, wherein when the external energy is applied to the sensor, the cracks are electrically short-circuited, or a spacing between the cracks changes, such that an electrical resistance value in the conductive layer is changed.

6. The sensor of claim 1, wherein the restoring force is generated by a functional group generated via reaction between a diacid and a triamine in the self-healing polymer layer.

7. The sensor of claim 1, wherein the restoring force is generated via a bond between oxygen and hydrogen contained in the self-healing polymer layer.

8. The sensor of claim 1, wherein the self-healing polymer layer is formed by a solution process.

9. The sensor of claim 1, wherein a depth of the crack has a nanometer or micrometer size.

10. The sensor of claim 1, wherein the conductive layer includes at least one selected from the group consisting of platinum, nickel, copper, gold, silver, iron, chromium, magnesium, zinc, tin, aluminum, cobalt, manganese, tungsten, cadmium, palladium, and carbon, or a mixture of two or more thereof.

11. The sensor of claim 1, wherein the sensor is used as one of a mechanical sensor, a chemical sensor and a gas sensor.

12. An electronic device comprising the crack sensor of claim 1.

* * * * *